United States Patent
Lian et al.

[11] Patent Number: 5,804,969
[45] Date of Patent: Sep. 8, 1998

[54] MRI RF COIL

[75] Inventors: Jianyu Lian, Cambridge, Mass.; Peter B. Roemer, North Andover, Mass.

[73] Assignee: Advanced Mammography Systems, Inc., Wilmington, Mass.

[21] Appl. No.: 847,431

[22] Filed: Apr. 24, 1997

Related U.S. Application Data

[63] Continuation of Ser. No. 506,969, Jul. 28, 1995, abandoned.

[51] Int. Cl.[6] .................................................. G01R 33/32
[52] U.S. Cl. ........................................ 324/318; 128/653.5
[58] Field of Search .................................. 324/300, 307, 324/309, 316, 318; 128/653.2, 653.5

[56] References Cited

U.S. PATENT DOCUMENTS

| | | | |
|---|---|---|---|
| 4,534,358 | 8/1985 | Young | 128/653 |
| 4,628,264 | 12/1986 | Rzedzian | 324/322 |
| 4,707,664 | 11/1987 | Fehn et al. | 324/322 |
| 4,724,398 | 2/1988 | Yokoyama | 330/278 |
| 4,725,779 | 2/1988 | Hyde et al. | 324/318 |
| 4,825,162 | 4/1989 | Roemer et al. | 324/318 |
| 4,940,941 | 7/1990 | Rzedzian | 324/312 |
| 5,024,229 | 6/1991 | Bryant et al. | 128/653 SC |
| 5,050,605 | 9/1991 | Eydelman et al. | 128/653 OSC |
| 5,078,141 | 1/1992 | Suzuki | 128/653.2 |
| 5,086,275 | 2/1992 | Roemer | 324/309 |
| 5,111,146 | 5/1992 | Kuhn | 324/318 |
| 5,136,244 | 8/1992 | Jones et al. | 324/318 |
| 5,139,024 | 8/1992 | Bryant et al. | 128/653.5 |
| 5,160,888 | 11/1992 | Laukien | 324/309 |
| 5,185,577 | 2/1993 | Minemura | 324/318 |
| 5,274,332 | 12/1993 | Jaskolski et al. | 324/318 |
| 5,277,183 | 1/1994 | Vij | 128/653.5 |
| 5,280,249 | 1/1994 | Kess | 324/318 |
| 5,294,886 | 3/1994 | Duerr | 324/318 |
| 5,363,845 | 11/1994 | Chowdhury | 128/653.5 |
| 5,416,413 | 5/1995 | Leussler | 324/318 |
| 5,489,847 | 2/1996 | Nabeshima et al. | 324/318 |

FOREIGN PATENT DOCUMENTS 4-332531  5/1991  Japan .

OTHER PUBLICATIONS

Roemer et al., "The NMR Phased Array "*Magnetic Resonance in Medicne*,16:192–225 (1990).

McGraw Hill, "Dictionary of Scientific and Technical Terms" p. 87s, 1984.

*Primary Examiner*—Sandra L. O'shea
*Assistant Examiner*—Micheal Eisenberg
*Attorney, Agent, or Firm*—Fish & Richardson P.C.

[57] ABSTRACT

An MRI RF coil has two resonant rings disposed along an axis. The resonant rings are inductively coupled, but are otherwise electrically isolated from one another. In an assembly having two such MRI RF coils, a decoupling element (e.g., a decoupling capacitor or inductor) electrically connected between one ring of one coil and one ring of the other coil decouples the coils.

35 Claims, 7 Drawing Sheets

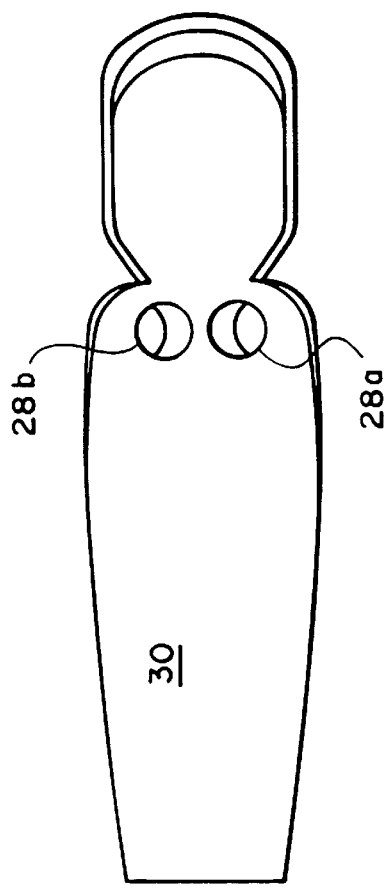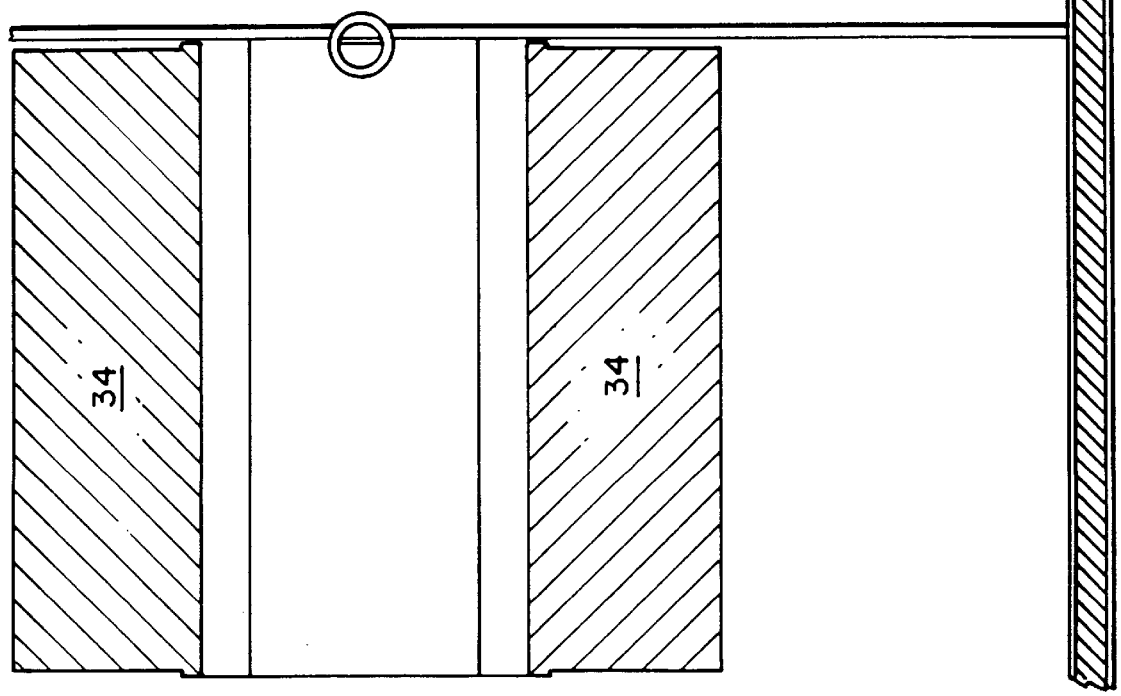
FIG. 5

MRI RF COIL

This is a continuation of application Ser. No. 08/506,969, filed Jul. 28, 1995 now abandoned.

BACKGROUND OF THE INVENTION

The invention relates to an RF coil for use in a magnetic resonance imaging (MRI) system.

MRI systems typically include a main magnet for generating a substantially homogeneous magnetic field ($B_0$) aligned, e.g., in the z-direction. Three electromagnetic "gradient coils" generate spatially varying magnetic field gradients (e.g., $G_x$, $G_y$, $G_z$) in each of three orthogonal (e.g., x, y, and z) directions. These magnetic field gradients combine with the homogeneous magnetic field at each point in the imaging volume to yield a net magnetic field B. As disclosed for example in U.S. Pat. No. 4,628,264, incorporated herein by reference in its entirety, the gradient coils can thus be operated to generate a spatially and temporally varying magnetic field $B(x,y,z,t)$.

The varying magnetic field performs a spatial encoding function. The resonant (or Larmor) frequency $\omega$ of a nucleus located at a point (e.g., $x_0$, $y_0$, $z_0$) within the imaging volume is a function of the strength of the magnetic field at that point:

$$\omega = \gamma B(x_0, y_0, z_0) \qquad (1)$$

where $\gamma$, the gyromagnetic ratio, is constant for a particular element in a particular compound. Because of the abundance of water in the human body, medical MRI typically images using hydrogen nuclei in water, which have a gyromagnetic ratio $\gamma$ of 4.26 kHz/Gauss. Thus, in a 0.5 Tesla magnetic field, the resonant frequency of hydrogen nuclei in water is approximately 21.3 MHz.

To excite the nuclei in a slice (e.g., a region of finite thickness disposed parallel to the x-y plane) of the imaging volume, a magnetic "slice select" gradient is first generated in the direction perpendicular to the slice (e.g, the z direction). Doing so generates an essentially uniform net magnetic field in the slice, causing all water hydrogen nuclei therein to have the same resonant frequency. An RF electromagnetic coil is used to generate a simultaneous rotating magnetic field at or near this resonant frequency, thereby exciting the hydrogen water nuclei in the slice.

Following excitation, the magnetic field gradients are controlled to spatially encode the excited nuclei, as disclosed for example in U.S. Pat. No. 4,940,941, incorporated herein by reference in its entirety. Throughout this process, the excited nuclei emit RF resonance signals, which are sensed by either the same RF coil that excited the nuclei or by a different coil. The sensed signals are then demodulated, digitized, and stored in one or more raw data matrices. After the imaging cycle concludes, an image may be obtained, e.g., by processing the raw data matrix (or matrices) using one-, two-, or three-dimensional Fourier transformation.

SUMMARY OF THE INVENTION

In one aspect of the invention, an MRI RF coil has two resonant rings disposed along an axis. The resonant rings are inductively coupled, but are otherwise electrically isolated from one another.

One of the two rings is typically directly electrically connected (e.g., capacitively coupled) or otherwise coupled to RF transmitting/receiving circuitry that, e.g., provides RF power to drive the coil to excite the nuclei and/or receives RF signals detected by the coil from the resonating nuclei. However, because there is no direct electrical connection between the two rings, the other ring can be physically disconnected from the assembly without breaking any electrical connections. Doing so allows access to the coil interior to expose at least a portion of the object being imaged (e.g., a female breast) without disturbing or reorienting either the patient or her breast.

Accordingly, a patient's breast or other body part may be positioned in the coil, an MR image generated, and one of the resonant rings detached to expose the breast. While still positioned in the coil, the breast may be then be subjected to diagnostic evaluation (e.g., a biopsy) or therapeutic treatment. After the diagnostic or therapeutic activity concludes, the ring may be reattached and another MR image generated to assess the success of the activity. Because the orientation of the breast has changed little if at all since the first image, the two images can easily be compared and contrasted.

Moreover, the insertion of certain objects, especially objects having non-cylindrical geometries (e.g., a foot), into the RF coil may be facilitated by first removing the detachable ring, positioning the object as desired, and reattaching the ring.

In addition, an RF coil with no direct electrical connection between two of its resonant rings is generally easier to manufacture than one having a direct electrical connection (e.g., a wire conductor) between the rings. Such a conductor also increases the resistance across the coil, and may generate an unwanted magnetic field that influences how effectively the coil transmits excitation pulses and/or receives MR signals.

Embodiments of the invention may include one or more of the following features.

A particularly useful embodiment includes a second RF coil, substantially identical to the first, positioned to admit the patient's other breast. To increase RF penetration in, and thus improve imaging of, the patient's chest wall and axilla region, the second RF coil is disposed along an axis that tilts towards and intersects the axis of the first coil. A decoupling capacitor or inductor (e.g., a variable capacitor or inductor) is electrically connected between one resonant ring of each of the coils.

Each coil is supported by a mounting structure, to which the detachable rings are removably attached. The rings are circular and all of the same diameter, and the two rings in each coil are separated by an amount equal to the radii of the rings (i.e., the coils are Helmholtz coils). Each ring includes a pair of capacitors (one of which may be variable) disposed 180° apart.

Another aspect of the invention includes an assembly having two MRI RF coils, each comprising a resonant ring. A decoupling element (e.g., a decoupling capacitor or inductor) is electrically connected between the rings of the coils to decouple the coils.

A decoupling capacitor (which in preferred embodiments is variable) transfers a capacitive reactance between the coils, compensating for mutual inductance to reduce or eliminate signal and noise "cross-talk" between the coils when they are operated in close proximity. Because of this decoupling capacitor, the coils need not be RF-shielded from one another or carefully positioned (e.g., overlapped) to reduce or eliminate mutual inductance. Rather, the coils can be positioned as desired, e.g., to best suit both the patient's anatomy and/or imaging requirements. Because of this decoupling, the two RF coils can be operated independently.

If more than two RF coils are used in the coil assembly, decoupling capacitors can be connected between each pair that exhibits mutual inductance.

Other advantages and features will become apparent from the following description of the preferred embodiments and from the claims.

BRIEF DESCRIPTION OF THE DRAWINGS

FIG. 5 is a partially sectional top view of the MRI system.

DESCRIPTION OF THE PREFERRED EMBODIMENTS

Figure 1:
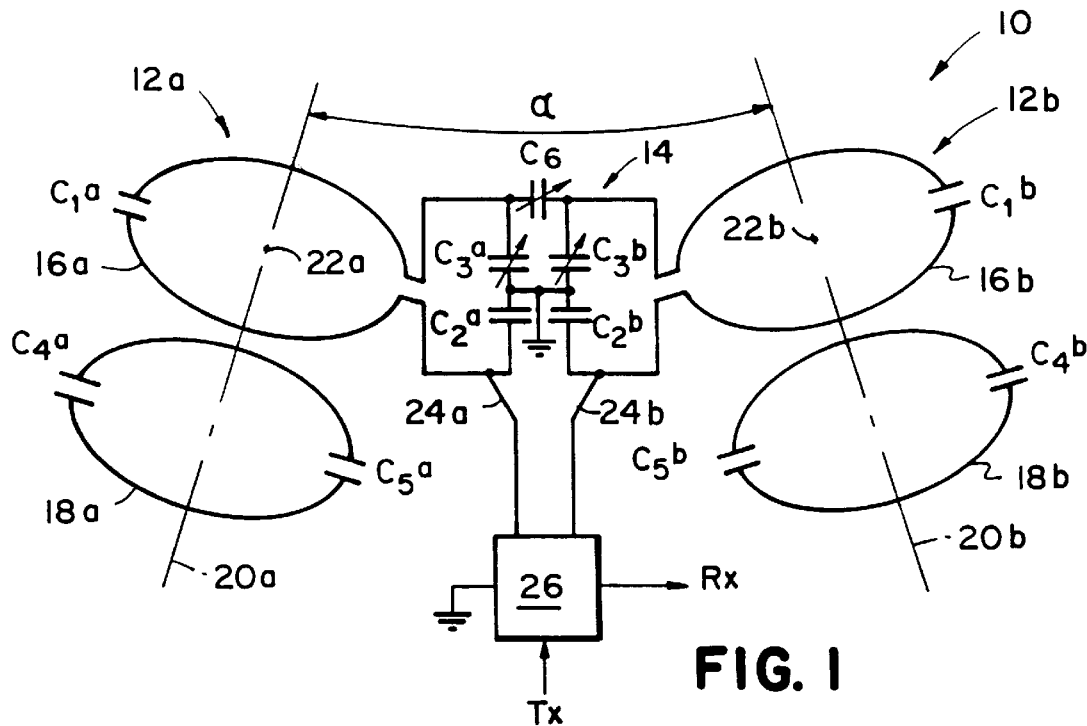
FIG. 1 is a schematic view of an MRI RF coil assembly showing two MRI RF coils in perspective.

As shown in FIG. 1, an MRI RF coil assembly 10 for imaging, e.g., female breasts (FIG. 6) includes left and right RF coils 12a, 12b and circuitry 14 connected therebetween.

Each of left and right coils 12a, 12b includes a top ring 16a, 16b and a bottom ring 18a, 18b disposed along and concentric with an axis 20a, 20b. In use, each of the patient's breasts are inserted into one of coils 12a, 12b through top rings 16a, 16b. To increase RF penetration in, and thus improve imaging of, the patient's chest wall and axilla region, axes 20a, 20b are tilted so that they lie at an angle α, e.g., 40°, with respect to one another.

Figure 6:
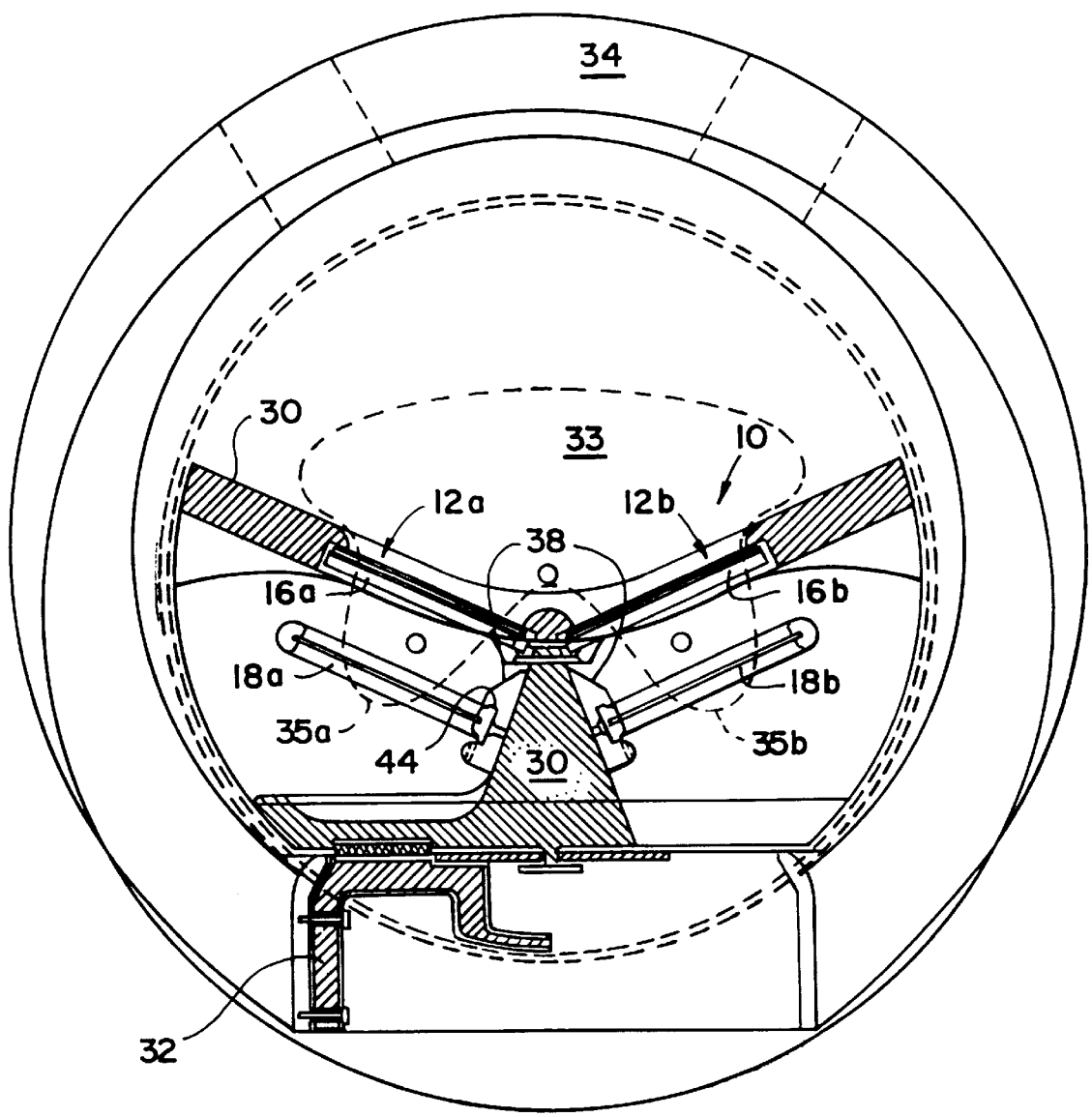
FIG. 6 is a partially sectional front view of the MRI system.

Rings 16a, 16b, 18a, 18b are round and sized (e.g., 16.5 cm in diameter) to admit one of the patient's breasts (FIG. 6). The distance between the centers 22a, 22b of top rings 16a, 16b, e.g., 20.9 cm, is selected to accommodate the anatomy of the typical patient (e.g., the distance between the typical patient's breasts). The top and bottom rings of each coil 12a, 12b are spaced apart along axes 20a, 20b a distance equal to the radius r of the rings, e.g., 8.25 cm. Each of RF coils 12a, 12b comprises a Helmholtz coil. Although the top and bottom rings can be spaced apart by distances greater or less than the radius r of the rings, the size of the homogeneous region typically decreases as the spacing varies from r. Generally, it is preferable to maximize the size of the homogeneous region. For many MRI applications it may be desirable for the spacing to be within about 25% of the radius, and preferably within about 3%.

Each of top rings 16a, 16b includes a capacitor $C_1a$, $C_1b$ having a capacitance of, e.g., 220 pf. Each of top rings 16a, 16b, is also split at a point 180° apart from capacitors $C_1a$, $C_1b$. Circuitry 14, which is directly electrically connected across these splits, includes additional capacitors, two of which, $C_2a$, $C_3a$, $C_2b$, $C_3b$ are connected in series with each of rings 16a, 16b. Capacitors $C_2a$, $C_2b$ are fixed-value capacitors, e.g., 940 pf, and provide the desired input/output impedance for left and right RF coils 12a, 12b, respectively. Capacitors $C_3a$, $C_3b$ are variable capacitors each comprised, e.g., of a 500 pf capacitor in parallel with a 1 to 30 pf trimmer capacitor. The effective capacitance $C_T$ provided by capacitors $C_1$, $C_2$, $C_3$ is:

$$C_T = \left[ \frac{1}{C_1} + \frac{1}{C_2} + \frac{1}{C_3} \right]^{-1} \quad (2)$$

The resonant frequency $f_T$ of each of top rings 16a, 16b is determined by the inductance $L_T$ of the ring, e.g., 0.40 μH, and the effective capacitance $C_T$:

$$f_T = \frac{1}{2\pi \sqrt{L_T C_T}} \quad (3)$$

The resonant frequency of top rings 16a, 16b can be fine-tuned by adjusting capacitors $C_3a$, $C_3b$ to change $C_T$.

Each of bottom rings 18a, 18b includes two capacitors, $C_4a$, $C_5a$, $C_4b$, $C_5b$, each e.g., 220 pf, located 180° apart. The effective capacitance $C_B$ provided by capacitors $C_4$, $C_5$ is:

$$C_B = \left[ \frac{1}{C_4} + \frac{1}{C_5} \right]^{-1} \quad (4)$$

The resonant frequency $f_B$ of each of bottom rings 18a, 18b is determined by the inductance $L_B$ of the ring, e.g., 0.40 μH, and the effective capacitance $C_B$:

$$f_B = \frac{1}{2\pi \sqrt{L_B C_B}} \quad (5)$$

Generally, capacitors $C_3a$, $C_3b$ are adjusted so that the resonant frequencies of the upper and lower rings of each coil $f_T$, $f_B$ are identical, or nearly so.

Figure 2:
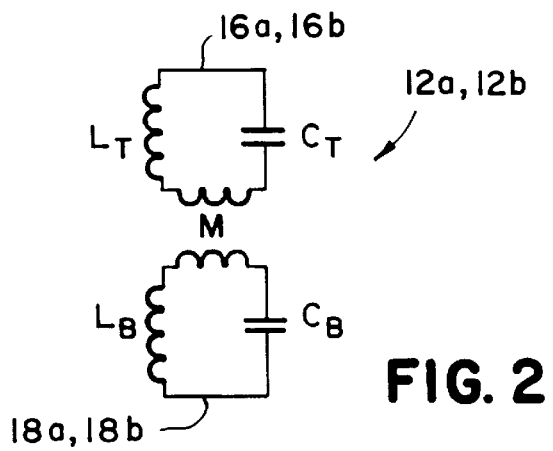
FIG. 2 is an equivalent circuit representation of one RF coil of the MRI RF coil assembly.

Only top rings 16a, 16b of coils 12a, 12b are directly electrically connected to circuitry 14. Bottom rings 18a, 18b are inductively coupled to their associated top rings 16a, 16b by mutual inductance M, as shown schematically in FIG. 2. Otherwise, bottom rings 18a, 18b are electrically isolated from top rings 16a, 16b and circuitry 14.

By virtue of this mutual inductance, each of RF coils 12a, 12b has two resonant modes, a symmetric mode in which the currents in the top and bottom loops flow in the same direction at resonant frequency $f_+$, and an asymmetric mode in which the currents in the top and bottom loops flow in opposite directions at resonant frequency $f_-$:

$$f_+ = \frac{1}{2\pi \sqrt{(L+M)C}} \quad (6)$$

$$f_- = \frac{1}{2\pi \sqrt{(L-M)C}} \quad (7)$$

If the "separation" between $f_+$ and $f_-$ (e.g., $|f_+ - f_-|$) is great enough, e.g., greater than the line width of the resonances, then each RF coil can be driven at its symmetric mode to excite nuclei and receive magnetic resonance signals.

Figure 3:
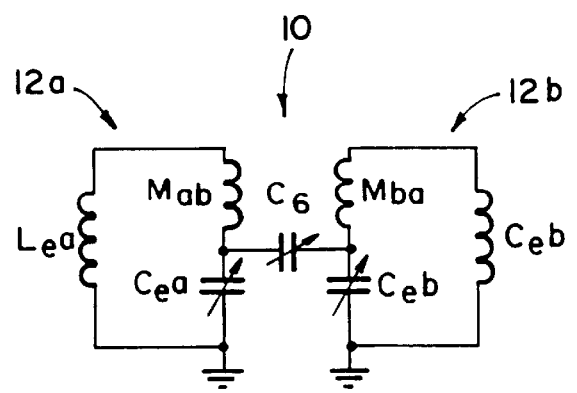
FIG. 3 is an equivalent circuit representation of the MRI RF coil assembly.

As shown in FIG. 3, each of coils 12a, 12b has an effective inductance $L_e a$, $L_e b$ and an effective capacitance $C_e a$, $C_e b$. Generally, $L_e a = L_e b = L_e$, and $C_e a = C_e b = C_e$.

Because they are operated in close proximity in coil assembly 10, mutual inductance $M_{ab}$, $M_{ba}$ exists between coils 12a, 12b. Because of the geometry of coil assembly 10 and the fact that $L_e a = L_e b$ and $C_e a = C_e b$, $M_{ab} = M_{ba} = -M_e$ ($M_e > 0$). Because of this mutual inductance, coil assembly 10 has two resonant modes, a symmetric mode in which the currents in coils 12a, 12b flow in the same direction at resonant frequency $f_+'$, and an asymmetric mode in which the currents in the coils flow in opposite directions at resonant frequency $f_-'$:

$$f_+' = \frac{1}{2\pi\sqrt{(L_e - M_e)C_e}} \qquad (8)$$

$$f_-' = \frac{1}{2\pi\sqrt{(L_e + M_e)C_e}} \qquad (9)$$

Typically, one or more of $C_e$, $L_e$, and $M_e$ are selected so that $f_-'$, the asymmetric mode resonant frequency, is at or near the resonant frequency of hydrogen nuclei in water (e.g., about 21.3 MHz in a 0.5 Tesla polarizing magnetic field).

An adjustable decoupling capacitor $C_6$ comprised, e.g., of a 150 pf capacitor in parallel with a 1 to 30 pf trimmer capacitor, is connected between coils 12a, 12b, and can be adjusted to decouple the coils. Capacitor $C_6$ can be adjusted to shift the symmetric mode resonant frequency $f_+'$ toward the asymmetric mode resonant frequency $f_-'$. When $f_+'=f_-'$, the resonant modes merge into a single mode. Properly adjusted in this manner, capacitor $C_6$ transfers capacitive reactance between the coils to compensate for cross-talk inductive reactance between coils 12a, 12b attributable to mutual inductance $M_e$. In this manner, the two coils are decoupled.

Because coils 12a, 12b are independently electrically tuned, they can be independently operated. As shown in FIG. 1, a pair of λ/2 cables 24a, 24b connects circuitry 14 to a T/R (transmit/receive) switch 26. To image a single breast in "single coil mode", only the coil 12a, 12b containing the breast to be imaged is connected to T/R switch 26. Either of two techniques may be used to image both breasts. In the "double coil mode," coils 12a, 12b are connected in parallel to T/R switch 26. In the "phased array mode," the two coils are operated independently.

In the single and double coil modes, MR data is acquired and processed using Fourier transformation techniques to generate one or more MR images. The signal-to-noise ratio of the acquired image is generally better in single coil mode than in double coil mode.

The signal-to-noise ratio of an image acquired in the phased array mode is comparable to that of an image acquired in the single coil mode. In the phased array mode, coils 12a, 12b are operated simultaneously and independently to acquire two separate sets of digitized MRI data. The data sets are then processed and combined after the MRI cycle concludes to generate a single image. The data sets can, e.g., be phase-shifted and combined in a manner dependent on the respective locations and orientations of coils 12a, 12b. The structures and operations of MRI phased arrays are disclosed generally in U.S. Pat. Nos. 4,825,162 and 5,086,275 and P. B. Roemer et al., "The NMR Phased Array," Magnetic Resonance in Medicine 16, 192–225 (1990), each of which references is incorporated herein by reference in its entirety.

As noted, there is no direct electrical connection between bottom rings 18a, 18b and top rings 16a, 16b. Thus, it is possible to position a patient's breasts in coil assembly 10, generate an MR image, and then detach one or both bottom rings 18a, 18b to expose the breast(s). The breast(s) may be then be subjected to diagnostic evaluation (e.g., biopsies) or therapeutic treatment without disturbing or reorienting the patient. After the diagnostic or therapeutic activity concludes, the bottom rings 18a, 18b may be reattached and another MR image generated to assess the success of the activity.

Figure 4:
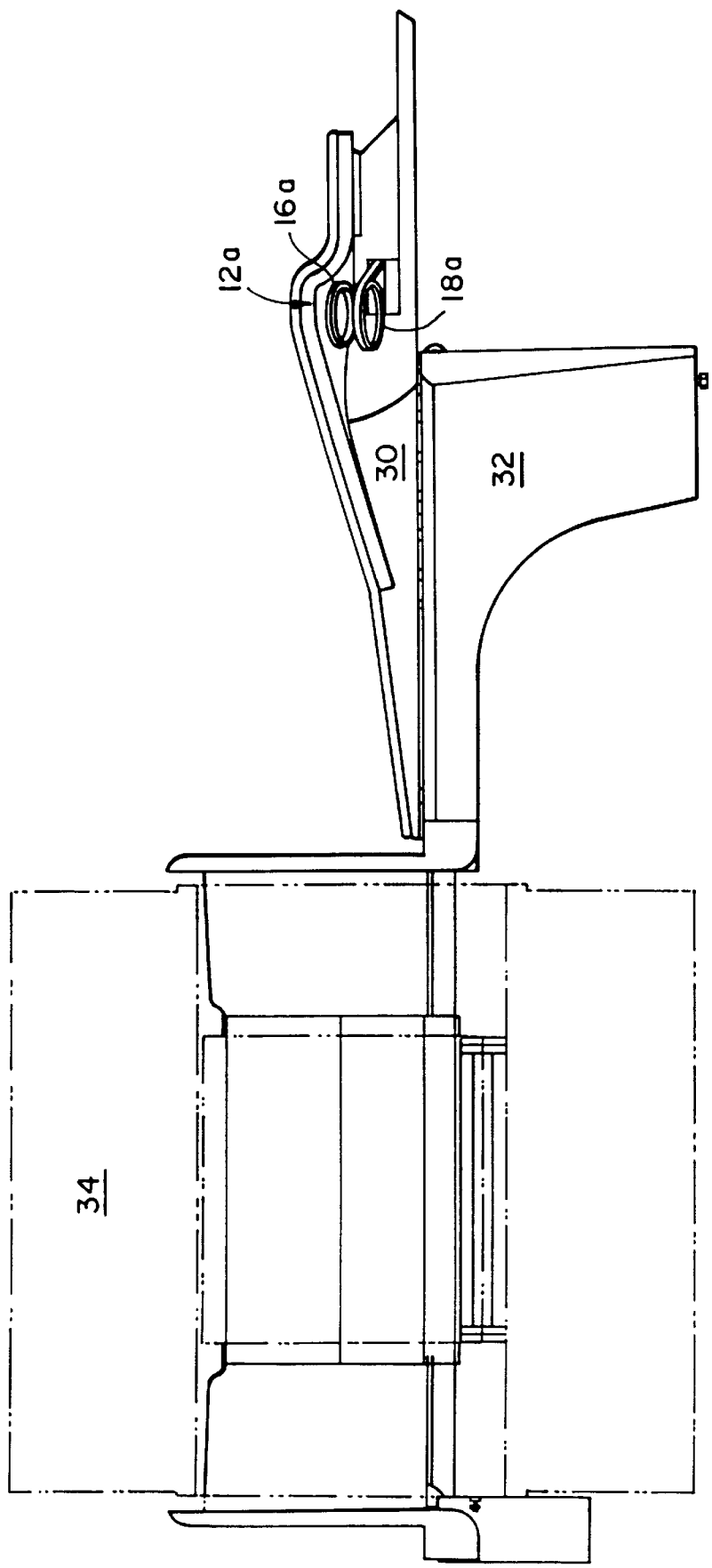
FIG. 4 is a side view of an MRI breast mammography system for use with the MRI RF coil assembly.

As shown in FIGS. 4, 5, and 6, RF coils 12a, 12b are supported beneath two adjacent holes 28a, 28b in a patient sled 30 that is slidable with respect to a base 32 into a magnet assembly 34. In operation, a patient 33 lies face-down on sled 30 so that her breasts 35a, 35b extend through holes 28a, 28b and into the volumes defined by coils 12a, 12b. The table is then slid, patient's feet-first, into magnet assembly 34.

Figure 7:
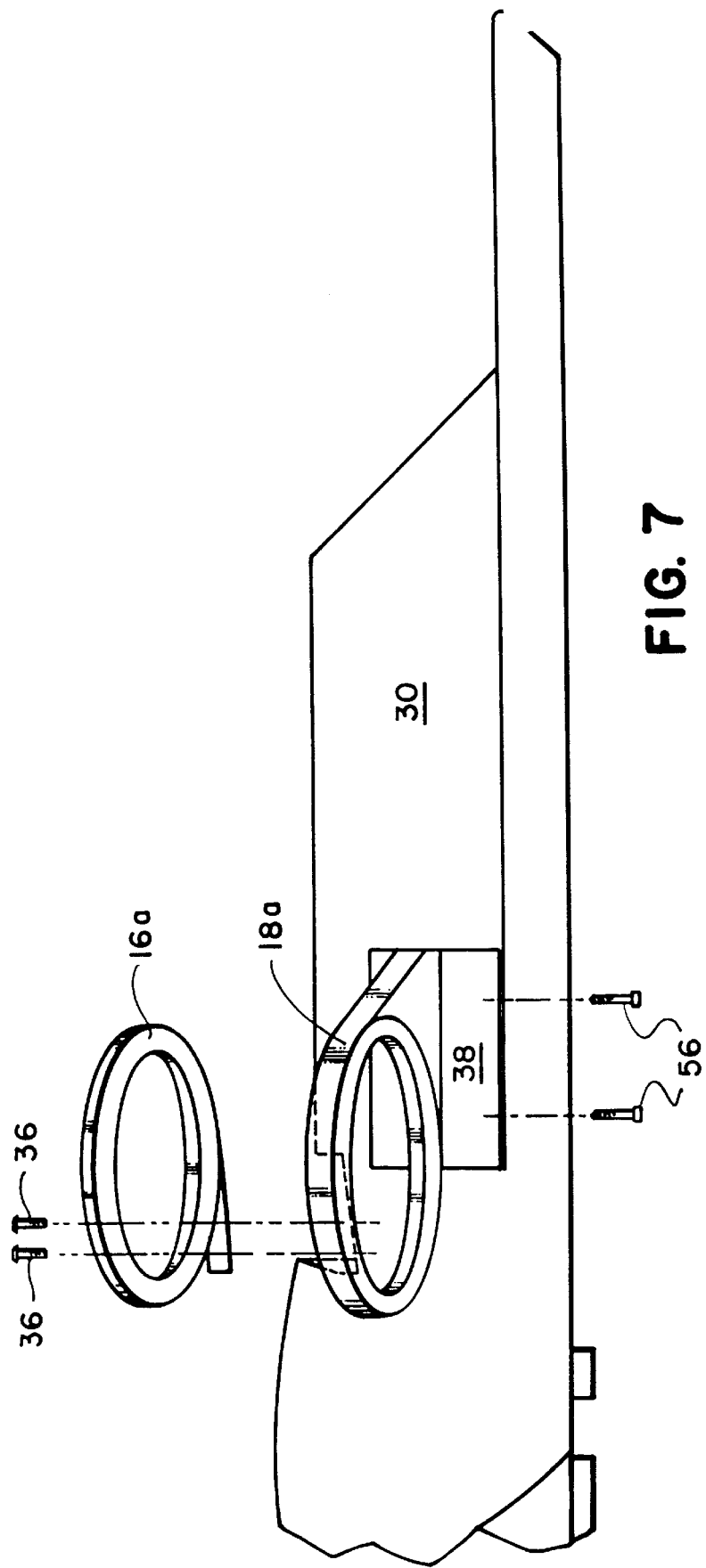
FIG. 7 is a partially exploded view showing the mounting structure for one RF coil of the MRI RF coil assembly.

As shown in FIG. 7, top rings 16a, 16b (only one shown in FIG. 7) of RF coils 12a, 12b are relatively permanently attached, e.g., by screws 36, to sled 30.

Figure 8:
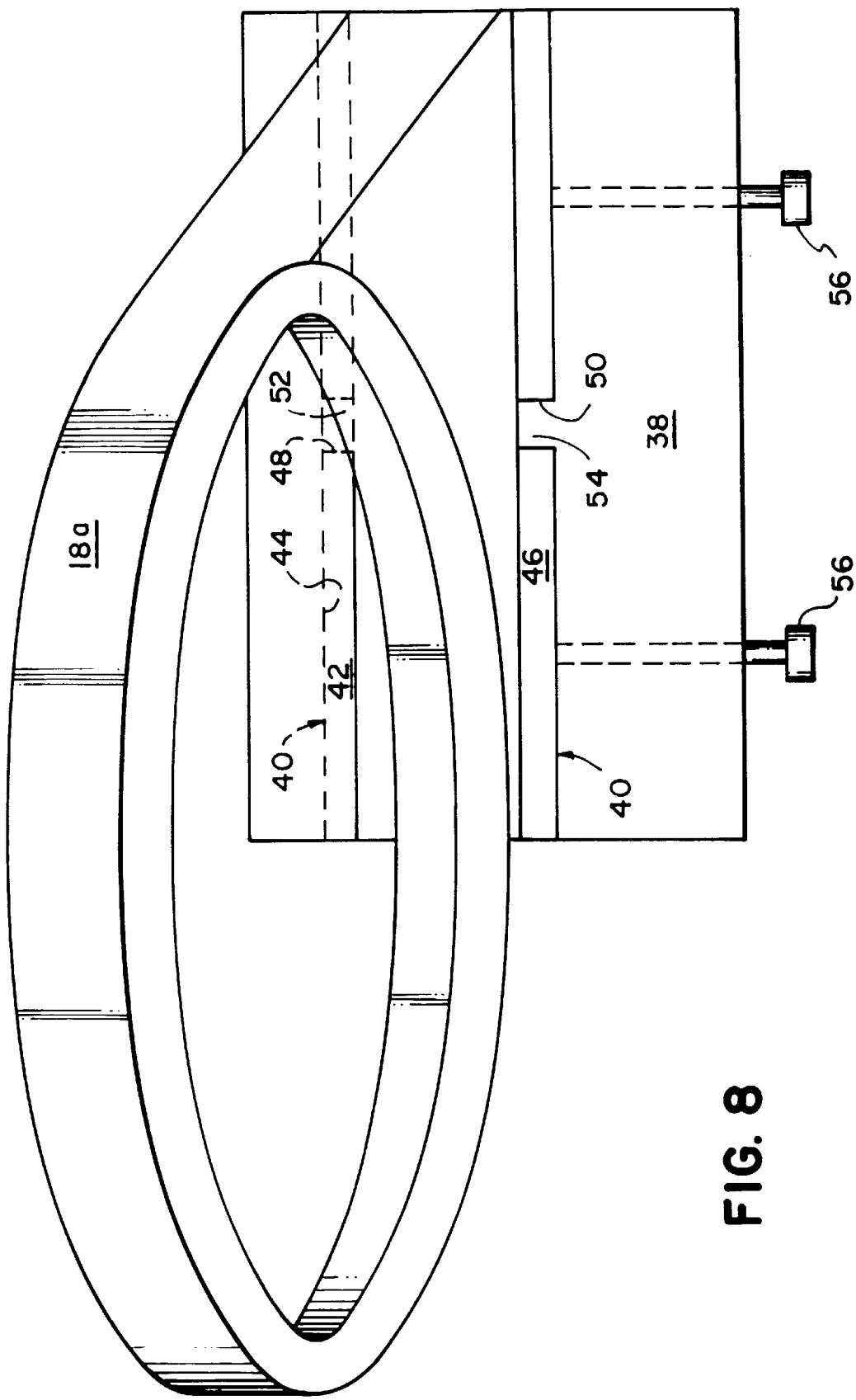
FIG. 8 shows the mounting structure for the bottom ring of the RF coil.

To facilitate detaching and reattaching, bottom rings 18a, 18b (only one shown in FIG. 7) are removably attached to a bracket 38 mounted to sled 30. The details of bottom ring 18a and bracket 38 are shown in FIGS. 6 and 8. Bottom ring 18a includes a flange 40 at the point where it contacts bracket 38. The top portion 42 of flange 40 seats in a groove 44 running the length of bracket 38. Both the top portion 42 of flange 40 and the bottom portion 46 of the flange include notches 48, 50 midway along their lengths. These notches mate with projecting regions 52, 54 of bracket 38 to ensure that bottom ring 18a and top ring 16a are concentric. When tightened, a pair of screws 56 threadably received in bracket 38 contact the bottom portion 46 of flange 40, keeping bottom ring 18a in place. To remove bottom ring 18a, screws 56 are loosened and the ring tilted up so that the bottom portion 46 of flange 40 disengages bracket 38 first. The ring may be reattached by reversing this process.

Other embodiments are within the scope of the following claims.

For instance, other objects besides breasts can be imaged using RF coils having two or more inductively coupled resonant rings. Each ring can be any type of resonant coil or subcoil, such as a birdcage coil, and can have any desired shape (e.g., it can be rectilinear in cross-section). The insertion of certain objects, especially objects having non-cylindrical geometries (e.g., a foot), into the RF coil may be facilitated by first removing the detachable ring, positioning the object as desired, and reattaching the ring.

Figure 9:
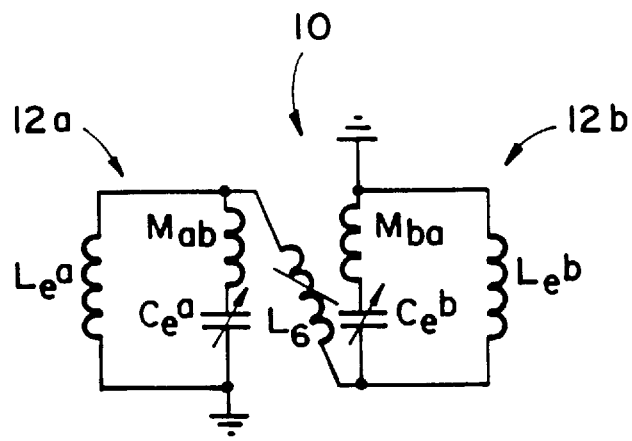
FIG. 9 is an equivalent circuit representation of the MRI RF coil assembly with a decoupling inductor.
Figure 10A:
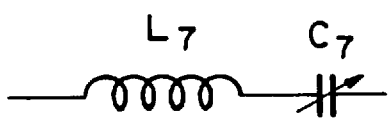
FIGS. 10A and 10B are schematics showing alternative decoupling circuits.
Figure 10B:
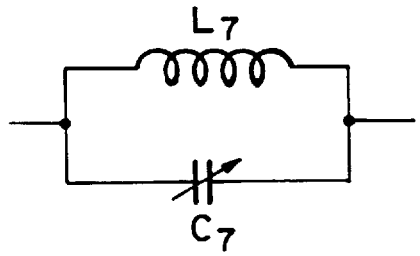

As shown in FIG. 9, coils 12a, 12b can also be decoupled by coupling a variable decoupling inductor $L_6$ between them. Inductor $L_6$, which is not electromagnetically coupled to coils 12a, 12b, can be adjusted to shift the asymmetric mode resonant frequency $f_-'$ (equation (9)) toward the symmetric mode resonant frequency $f_+'$ (equation (8)). When $f_+'=f_-'$, the resonant modes merge into a single mode. As shown in FIGS. 10A and 10B, a variable capacitor $C_7$ in series or parallel with a fixed-value inductor $L_7$ could be substituted for either $C_6$ (FIG. 3) or $L_6$.

Moreover, more than two RF coils may be used in a single RF coil assembly. The coils can be positioned as desired or necessary, e.g., to best suit both the patient's anatomy and/or imaging requirements. When using more than two RF coils in close proximity, decoupling capacitors and/or inductors can be connected between each pair that exhibits mutual inductance.

What is claimed is:

1. An MRI RF coil assembly comprising:

a mounting structure;

a first MRI RF coil disposed along a first longitudinal axis, said first RF coil including:

a first resonant ring carried by said mounting structure and disposed along said first axis;

a second resonant ring removably attached to said mounting structure and spaced apart from said first resonant ring along said first axis, said second ring being inductively coupled to and otherwise electrically isolated from said first resonant ring a second MRI RF coil disposed along a second axis, said second RF coil including:

a third resonant ring carried by said mounting structure and disposed along said second axis;

a fourth resonant ring removably attached to said mounting structure and disposed along said second axis, said fourth ring being inductively coupled to and otherwise electrically isolated from said third resonant ring;

a decoupling capacitor electrically connected between said first resonant ring of said first RF coil and said third resonant ring of said second RF coil;

said second resonant ring of said first RF coil being electrically isolated from said fourth resonant ring of said second RF coil.

2. An MRI RF coil assembly as recited in claim 1 wherein said first resonant ring and said second resonant ring comprise a Helmholtz coil.

3. An MRI RF coil assembly as recited in claim 1 wherein said first resonant ring is sized to admit a female human breast.

4. An MRI RF coil assembly as recited in claim 1 wherein said first resonant ring is substantially circular.

5. An MRI RF coil assembly as recited in claim 4 wherein the distance along said first axis between said first resonant ring and said second resonant ring is between 0.75 and 1.25 times the radius of said first resonant ring.

6. An MRI RF coil assembly as recited in claim 5 wherein said distance along said first axis between said first resonant ring and said second resonant ring is between 0.97 and 1.03 times said radius of said first resonant ring.

7. An MRI RF coil assembly as recited in claim 6 wherein said distance along said first axis between said first resonant ring and said second resonant ring substantially equals said radius of said first resonant ring.

8. An MRI RF coil assembly as recited in claim 1 wherein said second MRI RF coil is substantially identical to said first MRI RF coil.

9. An MRI RF coil assembly as recited in claim 1 wherein said first axis lies at a nonzero angle to said second axis.

10. An MRI RF coil assembly as recited in claim 9 wherein said first axis intersects said second axis.

11. An MRI RF coil assembly as recited in claim 1 wherein said first MRI RF coil and said second MRI RF coil are arranged to admit respective ones of a patient's breasts.

12. An MRI RF coil assembly as recited in claim 1 wherein said decoupling capacitor comprises a variable capacitor.

13. An MRI RF coil assembly as recited in claim 1 further comprising a decoupling inductor electrically connected between said first resonant ring of said first RF coil and said third resonant ring of said second RF coil.

14. An MRI RF coil assembly as recited in claim 1 wherein said first resonant ring includes a first capacitor.

15. An MRI RF coil assembly as recited in claim 14 wherein said first capacitor is variable.

16. An MRI RF coil assembly as recited in claim 14 wherein said first resonant ring includes a second capacitor.

17. An MRI RF coil assembly as recited in claim 16 wherein said first resonant ring is circular, and wherein said first capacitor and said second capacitor are disposed 180° apart.

18. An MRI RF coil assembly as recited in claim 1 wherein said second resonant ring is circular and includes two capacitors disposed 180° apart.

19. An MRI RF coil assembly comprising:

a mounting structure;

a first MRI RF coil disposed along a first longitudinal axis, said first RF coil including:

a first resonant ring carried by said mounting structure and disposed along said first axis;

a second resonant ring removably attached to said mounting structure and spaced apart from said first resonant ring along said first axis, said second ring being inductively coupled to and otherwise electrically isolated from said first resonant ring;

a second MRI RF coil disposed along a second axis, said second RF coil including:

a third resonant ring carried by said mounting structure and disposed along said second axis;

a fourth resonant ring removably attached to said mounting structure and disposed along said second axis, said fourth ring being inductively coupled to and otherwise electrically isolated from said third resonant ring;

a decoupling inductor directly electrically connected to said first resonant ring of said first RF coil and said third resonant ring of said second RF coil;

said second resonant ring of said first RF coil being electrically isolated from said fourth resonant ring of said second RF coil.

20. An MRI RF coil assembly as recited in claim 19 further comprising a capacitor connected in parallel with said decoupling inductor.

21. An MRI RF coil assembly as recited in claim 20 wherein said decoupling capacitor comprises a variable capacitor.

22. An MRI RF coil assembly as recited in claim 20 wherein a capacitance of said decoupling capacitor is chosen to substantially merge resonant modes of said MRI coil assembly.

23. An MRI RF coil assembly as recited in claim 20 wherein a capacitance of said decoupling capacitor is chosen to shift a symmetric resonant mode of said MRI coil assembly toward an asymmetric resonant mode of said MRI coil assembly.

24. An MRI RF coil assembly as recited in claim 20 wherein a capacitance of said decoupling capacitor is chosen to compensate for mutual inductance between said first RF coil and said second RF coil.

25. An MRI RF coil assembly as recited in claim 19 wherein said first axis lies at a nonzero angle to said second axis.

26. An MRI RF coil assembly as recited in claim 25 wherein said first axis intersects said second axis.

27. An MRI RF coil assembly as recited in claim 19 wherein said first resonant ring and said third resonant ring comprise a Helmholtz coil.

28. An MRI RF coil assembly as recited in claim 19 wherein said second MRI RF coil is substantially identical to said first MRI RF coil.

29. An MRI RF coil assembly as recited in claim 19 further comprising a capacitor connected in series with said decoupling inductor.

30. An MRI RF coil assembly comprising:

a mounting structure;

a first MRI RF coil carried by said mounting structure, said first RF coil including:

a first resonant ring disposed along a first axis;

a second resonant ring removably attached to said first resonant ring and disposed along said first axis, said second resonant ring being inductively coupled to and otherwise electrically isolated from said first resonant ring;

a second MRI RF coil carried by said mounting structure, said second RF coil including:
  a third resonant ring disposed along a second axis;
  a fourth resonant ring removably attached to said first resonant ring and disposed along said second axis, said fourth resonant ring being inductively coupled to and otherwise electrically isolated from said third resonant ring;
a decoupling element directly electrically connected between said first resonant ring of said first RF coil and said third resonant ring of said second RF coil;
said second resonant ring of said first RF coil being electrically isolated from said fourth resonant ring of said second RF coil.

31. An MRI RF coil assembly as recited in claim 30 wherein said decoupling element comprises a capacitor.

32. An MRI RF coil assembly as recited in claim 31 wherein a capacitance of said capacitor is chosen to substantially merge resonant modes of said MRI coil assembly.

33. An MRI RF coil assembly as recited in claim 31 wherein a capacitance of said capacitor is chosen to shift a symmetric resonant mode of said MRI coil assembly toward an asymmetric resonant mode of said MRI coil assembly.

34. An MRI RF coil assembly as recited in claim 31 wherein a capacitance of said capacitor is chosen to compensate for mutual inductance between said first RF coil and said second RF coil.

35. An MRI RF coil assembly as recited in claim 30 wherein said decoupling element comprises an inductor.

* * * * *

UNITED STATES PATENT AND TRADEMARK OFFICE
CERTIFICATE OF CORRECTION

PATENT NO.   : 5,804,969

DATED        : September 8, 1998

INVENTOR(S)  : Jianyu Lian and Peter B. Roemer

It is certified that error appears in the above-identified patent and that said Letters Patent is hereby corrected as shown below:

Cover page, [56] References Cited, OTHER PUBLICATIONS, the "Roemer" reference, "Medicne" should be --Medicine--.

Cover page, [56] References Cited, OTHER PUBLICATIONS, the "McGraw Hill" reference, "p. 87s" should be --p. 872--.

Column 5, line 16, "$f_+$" should be --$f_+'$--.

Column 9, line 4, "first" should be --third--.

Signed and Sealed this

Eleventh Day of May, 1999

Attest:

Q. TODD DICKINSON

*Attesting Officer*   Acting Commissioner of Patents and Trademarks